(12) United States Patent
Hu

(10) Patent No.: US 7,417,299 B2
(45) Date of Patent: Aug. 26, 2008

(54) DIRECT CONNECTION MULTI-CHIP SEMICONDUCTOR ELEMENT STRUCTURE

(75) Inventor: Chu-Chin Hu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 291 days.

(21) Appl. No.: 10/947,358

(22) Filed: Sep. 23, 2004

(65) Prior Publication Data
US 2006/0001152 A1 Jan. 5, 2006

(30) Foreign Application Priority Data
Jul. 2, 2004 (TW) ............................... 93119972 A

(51) Int. Cl.
*H01L 23/58* (2006.01)
*H01L 21/00* (2006.01)
*H05K 7/20* (2006.01)

(52) U.S. Cl. .................. 257/528; 257/713; 257/717; 257/724; 257/782; 257/E23.105; 361/709; 361/782; 438/122

(58) Field of Classification Search ............... None
See application file for complete search history.

(56) References Cited

U.S. PATENT DOCUMENTS

| 5,250,843 | A | * | 10/1993 | Eichelberger | ............... | 257/692 |
| 5,691,568 | A | * | 11/1997 | Chou et al. | ............... | 257/691 |
| 6,159,767 | A | * | 12/2000 | Eichelberger | ............... | 438/107 |
| 6,274,391 | B1 | * | 8/2001 | Wachtler et al. | ............... | 438/6 |
| 6,639,324 | B1 | * | 10/2003 | Chien | ............... | 257/778 |
| 6,709,898 | B1 | * | 3/2004 | Ma et al. | ............... | 438/122 |
| 6,865,089 | B2 | * | 3/2005 | Ho et al. | ............... | 361/761 |
| 2005/0121770 | A1 | * | 6/2005 | Baek et al. | ............... | 257/698 |

* cited by examiner

*Primary Examiner*—Alonzo Chambliss
(74) *Attorney, Agent, or Firm*—William F. Nixon; Clark & Brody

(57) ABSTRACT

A direct connection multi-chip semiconductor element structure is proposed. A plurality of semiconductor chips are mounted and supported on a metal heat sink, such that heat generated by the chips during operation can be dissipated via the heat sink. A circuit structure is extended from the chips to provide direct electrical extension for the chips and improve the electrical performances. And exposed electrical connection terminals can be formed in the circuit structure extended from the chips to be directly electrically connected to an external electronic device.

8 Claims, 4 Drawing Sheets

DIRECT CONNECTION MULTI-CHIP SEMICONDUCTOR ELEMENT STRUCTURE

FIELD OF THE INVENTION

The present invention relates to direct connection multi-chip semiconductor element structures, and more particularly, to a semiconductor element structure integrated with a plurality of semiconductor chips, which can directly provide external electrical connection for the semiconductor chips.

BACKGROUND OF THE INVENTION

Along with electronic products being developed toward having multi-functionality, high performances and high operating speed, semiconductor manufacturers have endeavored to provide a multi-chip module (MCM) for incorporating a plurality of chips in a semiconductor device to meet the above requirements for the electronic products.

U.S. Pat. No. 6,303,997 discloses a semiconductor device integrated with a plurality of chips. Referring to FIG. 1, on an upper surface of a substrate 10 there are provided a semiconductor chip 11 electrically connected to the substrate 10 and a fabricated BGA (ball grid array) semiconductor package 12. During fabrication of the multi-chip semiconductor device, the semiconductor chip 11 is first electrically connected to the upper surface of the substrate 10 via a plurality of bonding wires 111. Subsequently, the fabricated BGA semiconductor package 12 is electrically connected to the substrate 10 via a plurality of solder balls 121.

However, in the foregoing semiconductor device, a plurality of wire-bonding pads and solder-ball pads need to be provided on the substrate for electrically connecting the semiconductor chip and the semiconductor package to the substrate. This not only sets a limitation on the substrate layout but also requires high-density fabrication processes to form the pads, thereby increasing the fabrication cost. Additionally, since the electrical connection between the semiconductor chips in the semiconductor device is established through the bonding wires, the solder balls, and circuits of the substrate, such electrically conductive path is very complex and makes the electrical performances hard to be improved.

U.S. Pat. No. 5,783,870 discloses another semiconductor device incorporated with a plurality of chips, in which a plurality of semiconductor packages are integrated as a single module semiconductor device. Referring to FIG. 2, in this semiconductor device, a second semiconductor package 20b is stacked on a first semiconductor package 20a and is electrically connected to the first semiconductor package 20a by bonding a plurality of solder balls 21 of the second semiconductor package 20b to an upper surface of the first semiconductor package 20a. And a third semiconductor package 20c is stacked on and electrically connected to the second semiconductor package 20b in a similar manner.

However, the foregoing semiconductor device having the plurality of stacked semiconductor packages has significant drawbacks. Only areas aside from a chip attach region on a substrate of the underlying semiconductor package can be used for electrical connection with the solder balls of the overlying semiconductor package. In other words, electrically-connecting areas on the substrate of each of the stacked semiconductor package are restricted, thereby affecting the trace routability of the substrate, and the number and distribution of input/output (I/O) connections of the overlying semiconductor packages are also restricted, making the design flexibility of the entire semiconductor device undesirably reduced. Further, the plurality of semiconductor packages must formed before performing the stacking process, such that the overall fabrication processes are complex and the fabrication time and cost are increased. Moreover, the electrical connection between the semiconductor chips of the stacked semiconductor packages is still achieved via the substrate circuits and the solder balls of each of the semiconductor packages, such electrically conductive path is very complex and makes the electrical performances hard to be improved.

Additionally, since a plurality of semiconductor chips are incorporated in the foregoing multi-chip module (MCM), and electronic elements and circuits on the semiconductor chips are highly integrated, a large amount of heat would be generated by the semiconductor chips during operation. If the heat cannot be effectively dissipated, the performances and lifetime of the semiconductor chips would be reduced.

Furthermore, during general fabrication processes of a semiconductor device, chip carriers should be first fabricated by chip-carrier manufacturers (such as circuit-board manufacturers), and then the chip carriers can be subject to chip-mounting and molding processes by semiconductor packaging manufacturers to eventually form the semiconductor device having electronic performances such as integrated circuit design houses or integrated circuit manufactories. Therefore, such fabrication processes of the semiconductor device, involving different manufacturers such as chip-carrier manufacturers and semiconductor packaging manufacturers, are complicated and usually cause difficulty in interface integration. In case the client intends to alter the functional design of the semiconductor device, it would involve further complex change and interface integration, such that the flexibility in alteration and the economical effects cannot be achieved.

Therefore, the problem to be solved herein is to provide a highly integrated semiconductor device with improved electrical quality, which can be fabricated by simplified processes and at lower cost, and also can solve the problems of heat dissipation, packaging and interface integration.

SUMMARY OF THE INVENTION

In light of the above prior-art drawbacks, a primary objective of the present invention is to provide a direct connection multi-chip semiconductor element structure, by which a multi-chip module structure can be achieved using a simplified fabrication technique at reduced cost, and multiple chips can be integrated in a circuit board.

Another objective of the present invention is to provide a direct connection multi-chip semiconductor element structure, which can improve the quality of electrical connection between semiconductor chips of the multi-chip module structure.

Still another objective of the present invention is to provide a direct connection multi-chip semiconductor element structure, by which chip-carrier fabrication processes and semiconductor packaging processes can be integrated to provide more flexibility in fabrication according to a client's requirement and also simplify semiconductor fabrication and solve the problem of interface integration.

A further objective of the present invention is to provide a direct connection multi-chip semiconductor element structure, which can efficiently dissipate heat generated from the semiconductor chips during operation and provide an electromagnetic shielding effect to prevent the semiconductor device from being affected by external electromagnetic interference and noise.

A further objective of the present invention is to provide a direct connection multi-chip semiconductor element structure, which can eliminate the complex fabrication processes and equipment required for electrically connecting a semiconductor chip to a circuit board in the prior art.

In accordance with the above and other objectives, the present invention proposes a direct connection multi-chip semiconductor element structure, comprising: a heat sink; a plurality of semiconductor chips mounted on the heat sink; at least one insulating layer formed on a surface of the heat sink mounted with the semiconductor chips; and at least one patterned circuit layer formed on the insulating layer. The patterned circuit layer is electrically connected to the semiconductor chips via conductive means formed in the insulating layer, and also allows a part of the semiconductor chips to be electrically interconnected. Each of the semiconductor chips has an active surface and another surface opposite to the active surface, wherein the active surface is provided with a plurality of electrical contact pads thereon. The surfaces opposite to the active surfaces of the semiconductor chips are attached to the heat sink by means of an adhesive layer, such that heat generated by the chips can be efficiently dissipated via the heat sink. Further, a circuit structure may be extended from the chips through the use of the electrical contact pads thereof and the conductive means such as conductive bumps or conductive vias formed in the insulating layer. The heat sink can be made of a metal plate for carrying the semiconductor chips, or comprises a plurality of metal plate provided only at areas for carrying the semiconductor chips and a non-metal portion provided for the rest part of the heat sink.

Furthermore, the direct connection multi-chip semiconductor element structure in the present invention further comprises a plurality of passive components mounted on the patterned circuit layer to reduce noise and stabilize signal quality.

Additionally, in the direct connection multi-chip semiconductor element structure in the present invention, a plurality of exposed electrical connection terminals are extended from the patterned circuit layer to one side of the semiconductor element structure, such that the semiconductor element structure can be electrically connected to an external electronic device via the exposed electrical connection terminals.

Therefore, the direct connection multi-chip semiconductor element structure in the present invention has a plurality of semiconductor chips being mounted on a heat sink, such that heat generated by the semiconductor chips during operation can be effectively dissipated via the beat sink, and the heat sink also provides an electromagnetic shielding effect for the semiconductor chips. The semiconductor element structure incorporated with the plurality of semiconductor chips allows multiple chips to be integrated in a circuit board, thereby reducing the overall thickness of the semiconductor device to meet the size miniaturization requirement. Moreover, the direct connection multi-chip semiconductor element structure in the present invention facilitates direct extension of a circuit structure from the plurality of semiconductor chips to provide direct electrical extension for the semiconductor chips, thereby improving electrical performance for an electronic device having the semiconductor element structure. And exposed electrical connection terminals can be formed in the circuit structure extended from the chips, so as to achieve electrical connection between the semiconductor element structure and an external electronic device.

Furthermore, the direct connection multi-chip semiconductor element structure in the present invention incorporates the heat sink, the semiconductor chips, and the circuit structure, such that the chip-carrier fabrication processes and the semiconductor packaging processes can be combined to provide more flexibility in fabrication according to a client's requirement, and the semiconductor fabrication processes can be simplified, as well as the interface integration problem can be solved, unlike the complex fabrication processes and equipment required in the prior art for electrically connecting a semiconductor chip to a circuit board via wire-bonding or flip-chip technology or even to an external electronic device, such that the quality and reliability of the semiconductor device can be effectively improved in the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
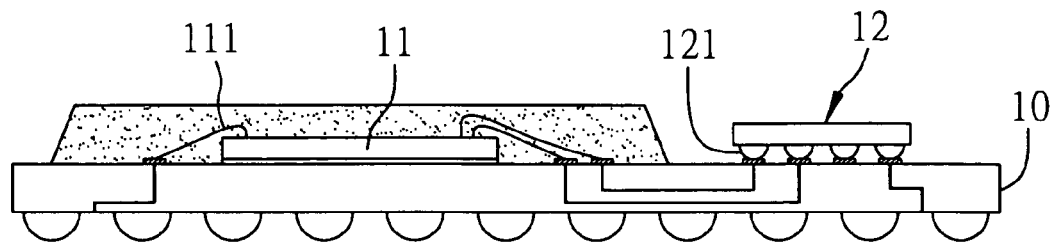
FIG. 1 (PRIOR ART) is a cross-sectional view of a conventional semiconductor device incorporated with a plurality of chips according to U.S. Pat. No. 6,303,997.
Figure 2:
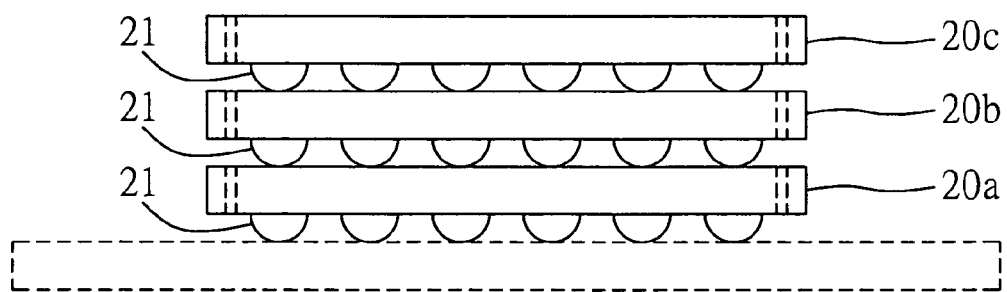
FIG. 2 (PRIOR ART) is a cross-sectional view of another conventional semiconductor device incorporated with a plurality of chips according to U.S. Pat. No. 5,783,870.
Figure 3A:
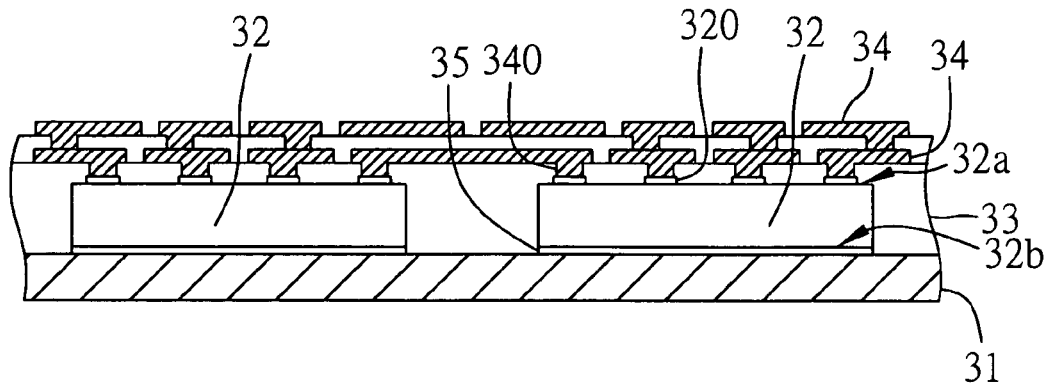
FIGS. 3A to 3C are cross-sectional views of a direct connection multi-chip semiconductor element structure according to the present invention.
Figure 3B:
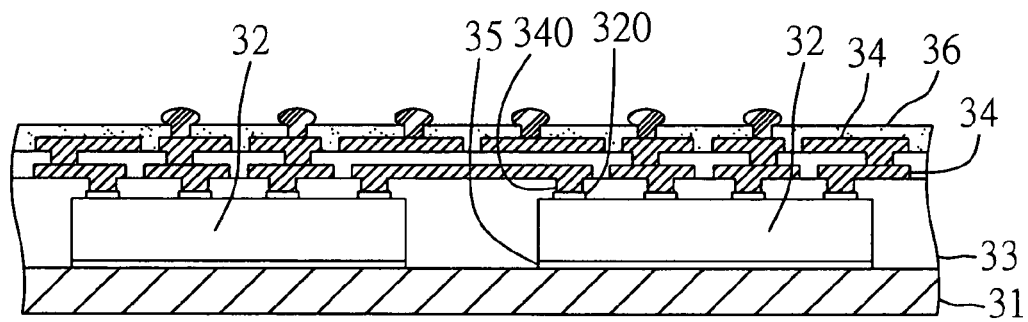

FIGS. 3A and 3B show cross-sectional views of a direct connection multi-chip semiconductor element structure according to the present invention.

Referring to FIG. 3A, the direct connection multi-chip semiconductor element structure proposed in the present invention comprises a heat sink 31; a plurality of semiconductor chips 32 mounted on the heat sink 31; at least one insulating layer 33 formed on a surface of the heat sink 31 mounted with the semiconductor chips 32; and at least one patterned circuit layer 34 formed on the insulating layer 33. The patterned circuit layer 34 is electrically connected to the semiconductor chips 32 via a plurality of conductive means 340 formed in the insulating layer 33, and also allows a part of the semiconductor chips 32 to be electrically interconnected.

The heat sink 31 can be made of a metal plate for carrying the plurality of semiconductor chips 32, or comprises a plurality of metal plates provided only at areas for carrying the semiconductor chips 32 and a non-metal structure provided for the rest part of the heat sink 31. The metal plate can be made of copper having a large coefficient of thermal conductivity.

Each of the semiconductor chips 32 has an active surface 32a and another surface 32b opposite to the active surface 32a, wherein the active surface 32a is provided with a plurality of electrical contact pads 320 thereon. The semiconductor chips 32 can be attached via their surfaces 32b to the heat sink 31 by means of a thermally conductive adhesive layer 35 such as silver paste. Thus, heat generated by the semiconductor chips 32 during operation can be directly dissipated via a thermally conductive path formed by the thermally conductive adhesive layer 35 and the heat sink 31, and also the heat sink 31 (metal plate) underneath the semiconductor chips 32 can provide an electromagnetic shielding effect for the semiconductor chips 32.

The insulating layer 33 can be made of epoxy resin, polyimide, cyanate ester, carbon fiber, Ajinomoto build-up film (ABF, manufactured by Ajinomoto Company, Japan), bismaleimide triazine (BT), or a mixture of epoxy resin and glass fiber. The insulating layer 33 may also be formed by successively applying a plurality of insulating layers on the heat sink 31.

The patterned circuit layer 34 can be formed on the insulating layer 33 by an electroplating, electroless plating or deposition process. The patterned circuit layer 34 is electrically connected to the electrical contact pads 320 of the semiconductor chips 32 by a plurality of conductive means 340 such as conductive bumps or conductive vias formed in the insulating layer 33. Moreover, the semiconductor chips 32 may also be electrically interconnected via the patterned circuit layer 34. In other words, the plurality of semiconductor chips 32 may be electrically extended through the electrical contact pads 320 thereof and the conductive means 340 such as conductive bumps or conductive vias formed in the insulating layer 33. It should be noted that, the patterned circuit layer 34 in the present invention is not limited to the two-layer structure shown in the drawings, but can be flexibly made as a one-layer structure or a multi-layer structure.

Referring to FIG. 3B, the direct connection multi-chip semiconductor element structure in the present invention further comprises a patterned solder mask layer 36 such as green paint formed on the patterned circuit layer 34. The patterned solder mask layer 36 has a plurality of openings formed by exposing and developing technologies to partially expose the patterned circuit layer 34 that can be electrically connected to an external electronic device via conductive elements such as solder balls or solder posts.

Figure 3C:
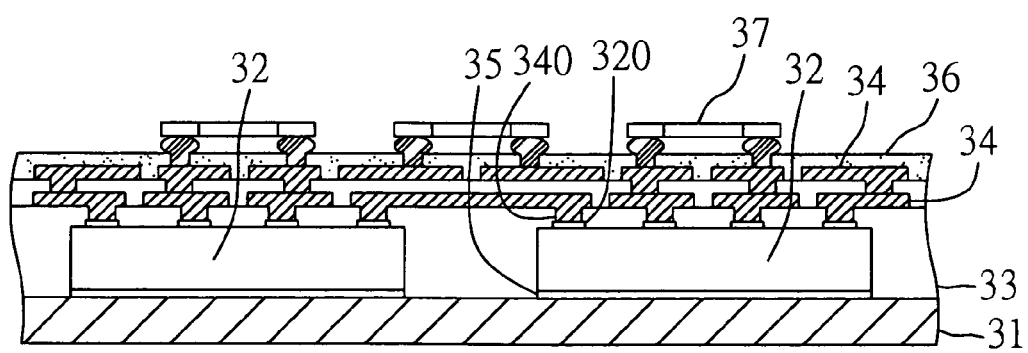
Figure 4A:
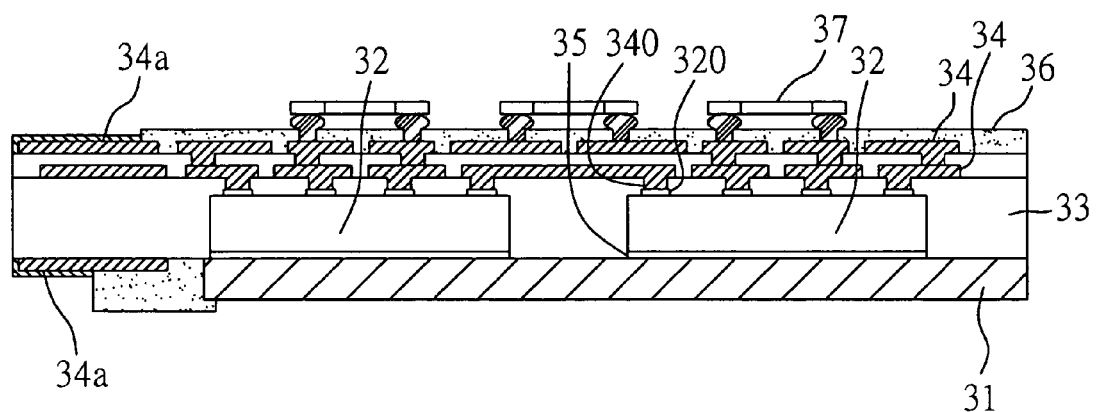
FIGS. 4A and 4B are cross-sectional views of a direct connection multi-chip semiconductor element structure provided with electrical connection terminals for being electrically connected to an external electronic device according to the present invention.
Figure 4B:
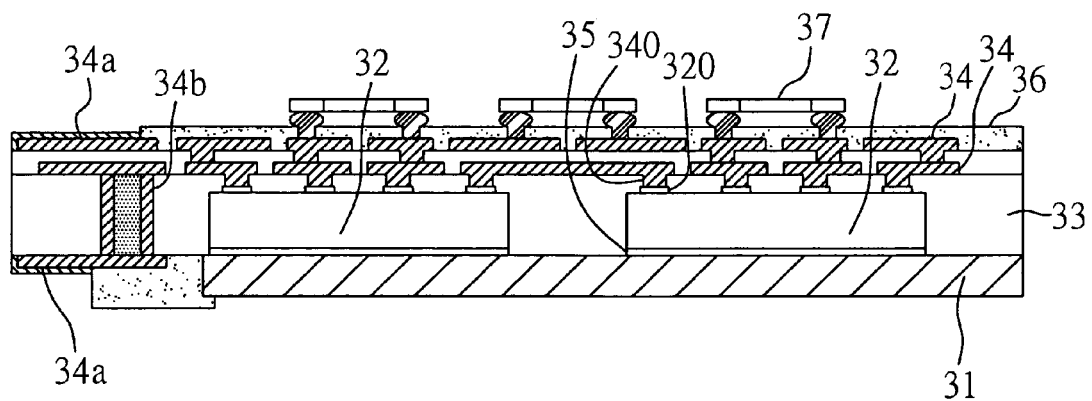
Figure 4C:
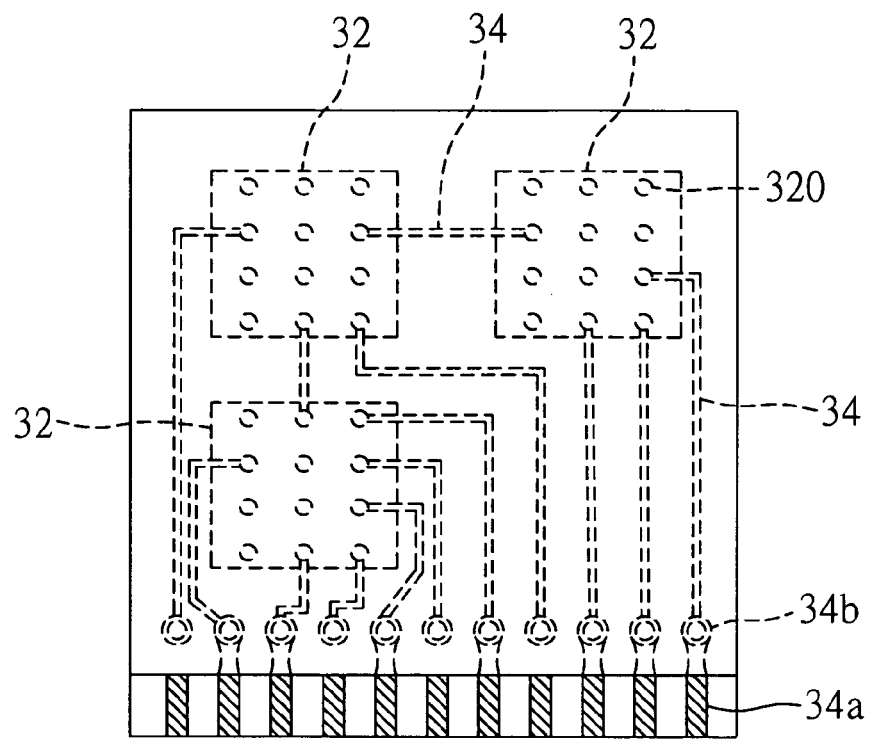
FIG. 4C is a partial perspective view showing the top of the direct connection multi-chip semiconductor element structure provided with electrical connection terminals for being electrically connected to an external electronic device according to the present invention.
Figure 4D:
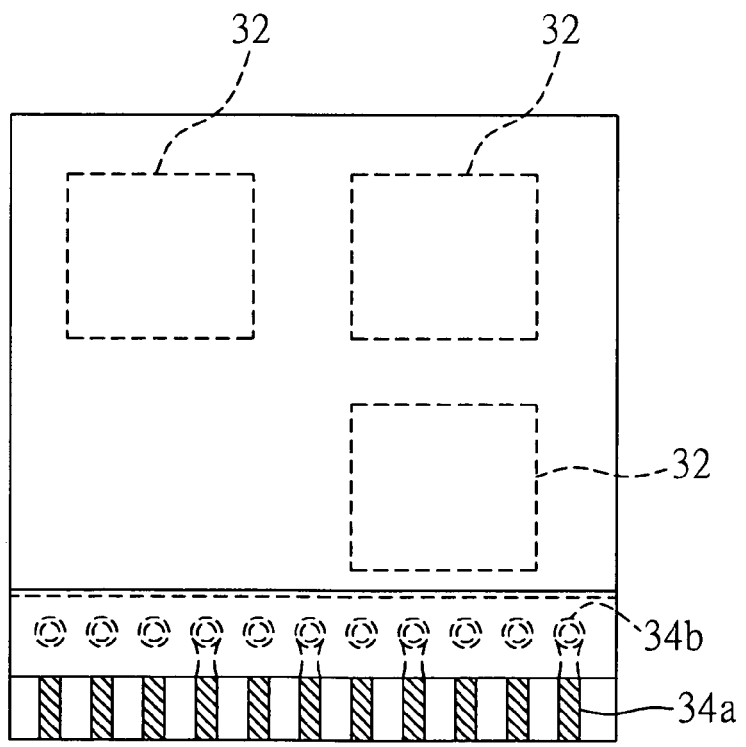
FIG. 4D is a partial perspective view showing the bottom of the direct connection multi-chip semiconductor element structure being provided with electrical connection terminals for being electrically connected to an external electronic device according to the present invention.

Referring to FIG. 3C, in the present invention, the part of the patterned circuit layer 34 exposed via the plurality of openings in the patterned solder mask layer 36 may be electrically connected to a plurality of passive components 37 by surface mount technology (SMT). The passive components 37 can be resistors, capacitors and inductors, which are used to improve or stabilize electrical performances of the electronic product.

Referring to FIGS. 4A to 4D, in order to allow the direct connection multi-chip semiconductor element structure in the present invention to be electrically connected to an external electronic device in a direct and effective manner, a plurality of electrical connection terminals 34a can be extended from the patterned circuit layer 34, which is electrically connected to the semiconductor chips 32 or the passive components 37, to one side of the semiconductor element structure and exposed. The exposed electrical connection terminals 34a serves as input/output (I/O) connections for the semiconductor element structure to be electrically connected to the external electronic device. In other words, the semiconductor chips 32 and the passive components 37 can be electrically connected to the external electronic device via the patterned circuit layer 34 and the exposed electrical connection terminals 34a extended from the patterned circuit layer 34. Moreover, in order to prevent the exposed electrical connection terminals 34a from being damaged by environmental oxidation or erosion, a gold (Au) metal layer serving as a protection layer can be formed on the electrical connection terminals 34a, which are thus customarily referred to as golden fingers. Additionally, referring to a cross-sectional view of FIG. 4B, a partial top view of FIG. 4C and a partial bottom view of FIG. 4D respective for the semiconductor element structure, the part of the patterned circuit layer 34 electrically connected to the semiconductor chips 32 can also be electrically extended to the exposed electrical connection terminals 34a via conductive through holes 34b formed through the insulating layer 33. The electrical connection terminals 34a can be provided on a top or bottom side of the semiconductor element structure, or on both top and bottom sides of the semiconductor element structure.

Therefore, the direct connection multi-chip semiconductor element structure in the present invention has a plurality of semiconductor chips being mounted on a heat sink, such that heat generated by the semiconductor chips during operation can be effectively dissipated via the heat sink, and the heat sink also provides an electromagnetic shielding effect for the semiconductor chips. The semiconductor element structure incorporated with the plurality of semiconductor chips allows multiple chips to be integrated in a circuit board, thereby reducing the overall thickness of the semiconductor device to meet the size miniaturization requirement. Moreover, the direct connection multi-chip semiconductor element structure in the present invention facilitates direct extension of a circuit structure from the plurality of semiconductor chips to provide direct electrical extension for the semiconductor chips, thereby improving electrical performance for an electronic device having the semiconductor element structure. And exposed electrical connection terminals can be formed in the circuit structure extended from the chips, so as to achieve electrical connection between the semiconductor element structure and an external electronic device. Furthermore, the direct connection multi-chip semiconductor element structure in the present invention incorporates the heat sink, the semiconductor chips, and the circuit structure, such that the chip-carrier fabrication processes and the semiconductor packaging processes can be combined to provide more flexibility in fabrication according to a client's requirement, and the semiconductor fabrication processes can be simplified, as well as the interface integration problem can be solved, unlike the complex fabrication processes and equipment required in the prior art for electrically connecting a semiconductor chip to a circuit board via wire-bonding or flip-chip technology or even to an external electronic device, such that the quality and reliability of the semiconductor device can be effectively improved in the present invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A direct connection multi-chip semiconductor element structure comprising:
    a heat sink;
    a plurality of semiconductor chips mounted on the heat sink;
    at least one insulating layer formed on a surface of the heat sink mounted with the semiconductor chips, wherein a conductive through hole is in the at least one insulating layer such that the at least one through hole is located outside a perimeter of the heat sink or the plurality of semiconductor chips;

at least one patterned circuit layer formed on the insulating layer, wherein the patterned circuit layer is electrically connected to the semiconductor chips via a plurality of conductive means formed in the insulating layer and provides electrical connection between a part of the semiconductor chips;

a patterned solder mask layer formed on the patterned circuit layer and having a plurality of openings for partially exposing the patterned circuit layer;

a plurality of exposed golden fingers extended from the patterned circuit layer and electrically connected to an external electronic device; and a plurality of passive components mounted on the part of the patterned circuit layer exposed via the openings of the patterned solder mask layer.

2. The direct connection multi-chip semiconductor element structure of claim 1, wherein each of the semiconductor chips has an active surface and another surface opposite to the active surface, and the active surface is provided with a plurality of electrical contacts pads thereon.

3. The direct connection multi-chip semiconductor element structure of claim 2, wherein the patterned circuit layer is electrically connected to the electrical contact pads of the semiconductor chips via the plurality of conductive means formed in the insulating layer.

4. The direct connection multi-chip semiconductor element structure of claim 2, wherein the surfaces opposite to the active surfaces of the semiconductor chips are attached to the heat sink via a thermally conductive adhesive layer.

5. The direct connection multi-chip semiconductor element structure of claim 1, wherein the conductive means formed in the insulating layer are conductive bumps or conductive vias.

6. The direct connection multi-chip semiconductor element structure of claim 1, wherein the heat sink is made of a metal plate for carrying the semiconductor chips.

7. The direct connection multi-chip semiconductor element structure of claim 1, wherein the insulating layer is made of a material selected from the group consisting of epoxy resin, polyimide, cyanate ester, carbon fiber, Ajinomoto build-up firm (ABF), bismaleimide triazine (BT), and a mixture of epoxy resin and glass fiber.

8. The direct connection multi-chip semiconductor element structure of claim 1, wherein the patterned circuit layer electrically connected to the semiconductor chips are electrically extended to the exposed electrical connection terminals via a plurality of conductive through holes formed through the insulating layers.

* * * * *